US009431965B1

(12) United States Patent
He et al.

(10) Patent No.: US 9,431,965 B1
(45) Date of Patent: Aug. 30, 2016

(54) SELECTABLE-INPUT-IMPEDANCE RADIO-FREQUENCY RECEPTION AMPLIFIER

(71) Applicant: Marvell International Ltd., Hamilton (BM)

(72) Inventors: Ming He, Fremont, CA (US); Nuntha Kumar Krishnasamy Maniam, Cupertino, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 14/606,813

(22) Filed: Jan. 27, 2015

Related U.S. Application Data

(60) Provisional application No. 61/932,059, filed on Jan. 27, 2014.

(51) Int. Cl.

| | |
|---|---|
| ***H04B 14/06*** | (2006.01) |
| ***H03F 1/02*** | (2006.01) |
| ***H03F 3/193*** | (2006.01) |
| ***H04B 1/44*** | (2006.01) |
| ***H04B 1/04*** | (2006.01) |
| ***H04B 1/00*** | (2006.01) |

(52) U.S. Cl.

CPC ............ *H03F 1/0205* (2013.01); *H03F 3/193* (2013.01); *H04B 1/0057* (2013.01); *H04B 1/0475* (2013.01); *H04B 1/44* (2013.01); *H03F 2200/165* (2013.01); *H03F 2200/267* (2013.01); *H03F 2200/451* (2013.01); *H04B 2001/045* (2013.01)

(58) Field of Classification Search

CPC ................ H03F 1/2025; H03F 3/193; H03F 2200/165; H03F 2200/451; H03F 2200/267; H04B 1/0057; H04B 1/44; H04B 2001/045; H04B 1/0475

See application file for complete search history.

(56) References Cited

U.S. PATENT DOCUMENTS

| | | | | | |
|---|---|---|---|---|---|
| 2007/0021088 | A1* | 1/2007 | Sheng-Fuh | H03F 1/565 | 455/319 |
| 2008/0198269 | A1* | 8/2008 | Gomez | H03J 5/12 | 348/707 |
| 2009/0081979 | A1* | 3/2009 | Wilhelm | H04B 7/0805 | 455/272 |
| 2010/0295629 | A1* | 11/2010 | Klemens | H03F 1/56 | 333/126 |
| 2011/0175789 | A1* | 7/2011 | Lee | H01Q 1/243 | 343/853 |
| 2013/0069737 | A1* | 3/2013 | See | H04B 1/18 | 333/32 |
| 2013/0214979 | A1* | 8/2013 | McMilin | H01Q 9/42 | 343/750 |

* cited by examiner

*Primary Examiner* — Syed Haider

(57) ABSTRACT

A radio-frequency amplifier includes a matching network comprising a switching unit. The switching unit is operable in a first condition to provide a selected impedance at a first selected frequency. The switching unit is operable in a second condition to form a bandstop filter. A stop band of the bandstop filter includes a second selected frequency. The first selected frequency may be a second harmonic of a transmission frequency different from the second selected frequency. A multi-band transceiver is also described, as is a method of transmitting a first signal and a second signal.

25 Claims, 4 Drawing Sheets

SELECTABLE-INPUT-IMPEDANCE RADIO-FREQUENCY RECEPTION AMPLIFIER

CROSS REFERENCE TO RELATED APPLICATION

The present disclosure claims priority to U.S. Patent Application No. 61/932,059, filed on Jan. 27, 2014, which is incorporated herein by reference.

BACKGROUND

The background description provided herein is for the purpose of generally presenting the context of the disclosure. Work of one or more of the presently named inventors, to the extent such work is described in this background section, as well as aspects of the description that may not otherwise qualify as prior art at the time of filing, are neither expressly nor impliedly admitted as prior art against the present disclosure.

Various wireless standards, such as WI-FI, may operate on multiple radio-frequency (RF) bands. For example, Standard 802.11n-2009 by the Institute of Electrical and Electronics Engineers (IEEE) may be used in the 2.4 gigahertz (GHz) band or the 5 GHz band. This may require multi-band transceivers or other components of a radio.

A second harmonic is a form of non-linearity that is located substantially at twice the fundamental frequency of a desired signal. Second harmonics may be present in various amplifiers, e.g., power amplifiers in wireless-communication transceivers or power amplifiers.

For a wireless transmitter, governmental and international regulations may specify the maximum permissible emissions in selected frequency bands. Second harmonics may be the strongest distortion tone from a transmitter. Some prior schemes use filters at the frequency of the second harmonic. However, a disadvantage of this approach is that the filters may increase the insertion loss and reduce the power efficiency of the transmitter. Filters may also increase the physical size of the radio and thus the size of components incorporating the radio, e.g., cellular telephones or wireless-network adapters.

SUMMARY

In various embodiments, the present disclosure provides a radio-frequency amplifier, comprising a matching network comprising a switching unit, wherein the switching unit is operable to, in a first condition, provide a selected impedance at a first selected frequency; and, in a second condition, form a bandstop filter, a stop band of the bandstop filter including a second selected frequency.

In various embodiments, the present disclosure provides a multi-band transceiver, comprising a first-band interface unit for a first radio-frequency band having a first-band reference frequency, the first-band interface unit including a first-band transmission amplifier selectively connectable to a first-band common node; a second-band interface unit for a second, different radio-frequency band having a second-band reference frequency, the second-band interface unit comprising a second-band transmission amplifier, a second-band reception amplifier comprising two input terminals, and a second-band transmit/receive switch connected to at least one of the two input terminals of the second-band reception amplifier and configured to selectively connect the second-band transmission amplifier and the second-band reception amplifier to a second-band common node; a diplexer connecting the first-band and second-band common nodes and comprising an antenna port configured for connection to an antenna, wherein the diplexer is configured to selectively attenuate signals from the first-band transmission amplifier substantially at a selected harmonic of the first-band reference frequency; and a controller configured to operate the first-band interface unit and the second-band interface unit to selectively provide transmission of signals in the first band or transmission of signals in the second band. The second-band reception amplifier is responsive to the controller to, in a first condition, provide a selected impedance into the two input terminals at the selected harmonic of the first-band reference frequency; and, in a second condition, provide a bandstop filter across the two input terminals, a stop band of the bandstop filter including the second-band reference frequency.

In various embodiments, the present disclosure provides a method of transmitting a first signal and a second signal, the method comprising transmitting the first signal using a first-band transmission amplifier for a first radio-frequency band; configuring a controlled-impedance resonant filter at a second-band reception amplifier for a second, different radio-frequency band, wherein the controlled-impedance resonant filter provides a selected impedance at a selected harmonic of a reference frequency of the first radio-frequency band; configuring a resonant bandstop filter at the second-band reception amplifier, wherein a stop band of the resonant bandstop filter includes a reference frequency of the second radio-frequency band; and transmitting the second signal using a second-band transmission amplifier for the second radio-frequency band.

Various aspects attenuate noise such as second-harmonic noise, reducing insertion loss and increasing power efficiency. Various aspects attenuate noise while maintaining transmission performance of a multi-band transceiver.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items.

DETAILED DESCRIPTION

The present disclosure describes a radio-frequency amplifier. In one embodiment, a switching unit is configured to selectively provide a selected impedance or a bandstop filter. In another embodiment, a multi-band transceiver is described. The multi-band transceiver may be used in a described or other radio-frequency amplifier. In another embodiment, a method of sending a signal is described. Some embodiments may provide improved second-harmonic rejection compared to conventional schemes.

Figure 1:
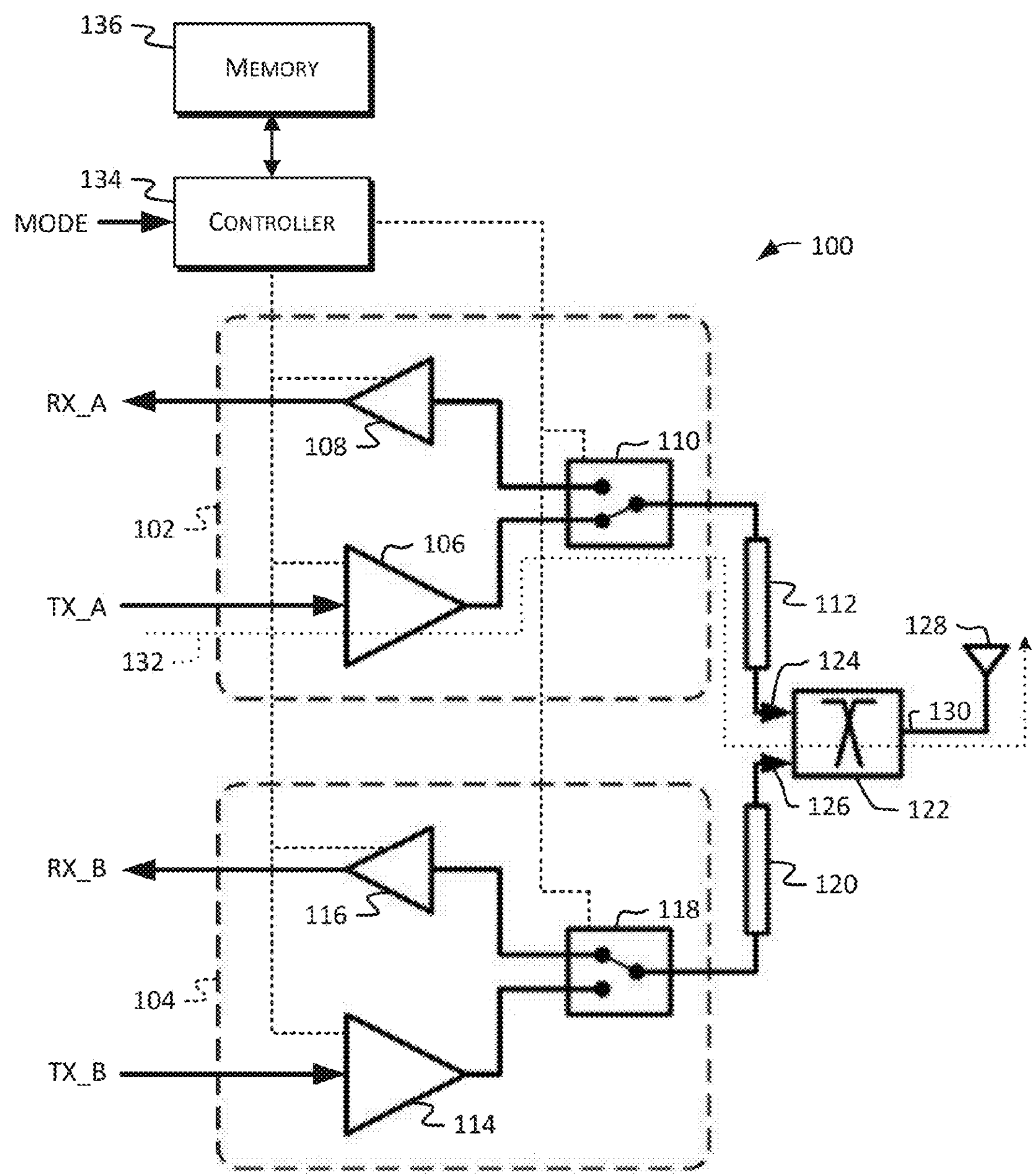
FIG. 1 is a block diagram of a multi-band transceiver according to various embodiments.

FIG. 1 illustrates an embodiment of a multi-band transceiver 100, e.g., an 802.11n or other wireless local area network (WLAN) transceiver. In general, transceiver 100 may operate at any RF frequencies. Transceiver 100 may be integrated with other components, e.g., microprocessors, baseband processors, or other filters, to provide a complete WLAN interface. Multi-band transceiver 100 may also be used with multi-band technologies other than for WLANs, e.g., multi-band cellular-phone transmissions. For example, multi-band second-generation cellular phones may include transceivers 100 configured to communicate on at least two of the 800 megahertz (MHz), 900 MHz, 1800 MHz, and 1900 MHz bands. Long-term Evolution (LTE) cellular phones may include transceivers 100 configured to communicate on at least two of the 1800 MHz, 2300 MHz, and 2600 MHz bands. As used herein, the term "RF" refers to the full electromagnetic spectrum at >0 Hz or portions thereof, e.g., >120 Hz, 800 MHz-2100 MHz, or other ranges. In an example, bands used herein are located in industrial/scientific/medical (ISM) reserved bands.

Throughout this discussion, the term "multi-band" refers to two or more bands, e.g., three bands. Throughout this discussion, WI-FI is used as a nonlimiting example for clarity. Some WI-FI configurations operate on a band between ~2.4 GHz and ~2.5 GHz, and also on a band between ~5.2 GHz and ~5.7 GHz. For brevity, example bands are referred to herein as bands A and B. Each band may have a reference frequency, e.g., 2.4 GHz or 4.8 GHz. Throughout this disclosure, in the context of discussion of a signal, "downstream" refers to the direction of signal flow, and "upstream" refers to the opposite direction. Examples of radio frequencies include but are not limited to frequencies of electromagnetic radiation between 1 kHz and 500 GHz, between 3 kHz and 300 GHz, or between 3 Hz and 3 THz.

Illustrated example multi-band transceiver 100 includes two interface units 102, 104. Interface unit 102 corresponds to band A, which is a first radio-frequency band having a first-band reference frequency (e.g., 2.4 GHz). Data TX_A to be transmitted is provided to first-band transmission (TX) amplifier 106 of interface unit 102. Data received in band A (RX_A) is output by first-band reception (RX) amplifier 108 of interface unit 102. First-band transmit/receive (T/R) switch 110 of interface unit 102 selectively connects one of amplifiers 106, 108 to feed line 112. Feed line 112 is an example of a first-band common node.

Similarly, interface unit 104 includes second-band TX amplifier 114 receiving data (TX_B) to be transmitted and second-band RX amplifier 116 providing data (RX_B) received in band B. Band B is a second, different radio-frequency band having a second-band reference frequency (e.g., 5 GHz). Second-band T/R switch 118 connects amplifiers 114, 116 to feed line 120. Feed line 120 is an example of a second-band common node.

Feed lines 112, 120, which may include printed-circuit board (PCB) traces, are connected to diplexer 122 at respective ports 124, 126. Diplexer 122 is also connected to antenna 128 at antenna port 130. Diplexer 122 is configured to selectively attenuate signals from the first-band TX amplifier 106 substantially at a selected harmonic of the first-band reference frequency. The selected harmonic may be, e.g., a second harmonic. In some examples, diplexer 122 may apply a low-pass filter and a bandstop filter to signals from feed line 112 and apply a high-pass filter and a bandstop filter to signals from feed line 120. Additional filters or amplifiers not shown may be used, e.g., between diplexer 122 and antenna 128, or on feed lines 112, 120. Signal path 132 (shown dotted for clarity) shows flow of signals from TX_A through TX amplifier 106, T/R switch 110, feed line 112, and diplexer 122, to antenna 128, and is discussed below.

In this example, RX amplifiers 108, 116 are controlled by a controller 134 responsive to a MODE input (indicated by short-dash lines for clarity). The MODE input may be provided, e.g., by a baseband processor or microcontroller of a radio. In some examples, each RX amplifier 108, 116 is controlled by a respective controller (not shown). In some examples, controller 134 also controls TX amplifiers 106, 114, or respective controllers (not shown) control TX amplifiers 106, 114. In the illustrated example, controller 134 also controls T/R switches 110, 118. The MODE input may cause controller 134 to configure the transceiver 100 for any one of first-band transmission using TX amplifier 106, first-band reception using RX amplifier 108, second-band transmission using TX amplifier 114, and second-band reception using RX amplifier 116, at any given time. In some examples, controller 134 may operate the first-band and second-band interface units 102, 104 to selectively provide transmission of signals in the first band or transmission of signals in the second band.

In some examples, the second-band RX amplifier 116 has two input terminals, and second-band T/R switch 118 is connected to at least one of the input terminals of the second-band RX amplifier 116. The second-band RX amplifier 116 is responsive to controller 134 to provide a selected impedance into the two input terminals. This can be done in a first condition, e.g., during first-band transmission. The selected impedance may be, e.g., 50Ω, 50±10Ω or ±10%, 40Ω to 60Ω, 75Ω, 75±10Ω or ±10%, 65Ω to 85Ω, or other impedances. The second-band RX amplifier 116 is further responsive to controller 134 to provide a bandstop filter across the two input terminals. A stop band of the bandstop filter includes the second-band reference frequency. This can be done in a second condition, e.g., during second-band transmission. Further details of some of these examples are described below with reference to FIG. 3.

In some examples, controller 134 is connected to memory 136. Memory 136 may include instructions stored thereon that, if executed, e.g., by controller 134, result in the operations described herein. Memory 136 may include one or more computer-readable media, each of which may be one or the other of a tangible, non-transitory computer storage medium or a communication medium such as a modulated data signal. As defined herein, computer storage media do not include communication media. That is, computer storage media do not include communications media consisting solely of a modulated data signal, a carrier wave, or a propagated signal, per se.

Different devices may of course be implemented in different ways, and may have different physical configurations. The device shown in FIG. 1 is merely an example of one possible implementation, serving to illustrate integration of functions and capabilities for multiple bands in a single device.

Figure 2:
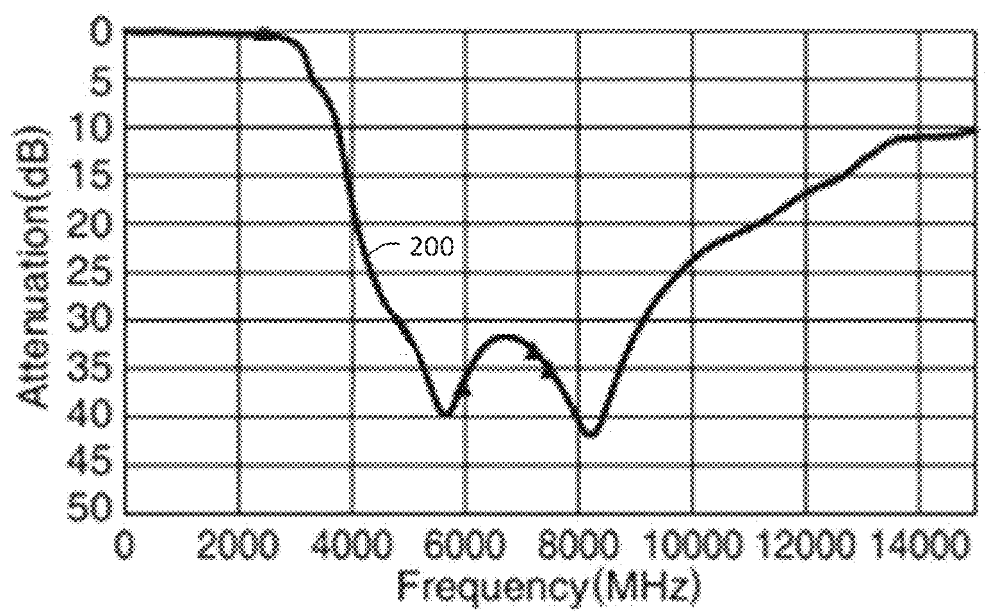
FIG. 2 is a diagram illustrating an example transfer function of a diplexer according to various embodiments.

FIG. 2 illustrates, at curve 200, an example transfer function of diplexer 122 as viewed from feed line 112. Curve 200 represents attenuation (decibels, dB) as a function of frequency (MHz). The represented attenuation is the negative of the gain of diplexer 122. Curve 200 includes a low-pass portion from direct current (DC, 0 hertz) to ~5 GHz and a bandstop portion from ~5 GHz to ~8 GHz. Curve 200 passes through the points given in Table 1.

TABLE 1

| Frequency (MHz) | Attenuation (dB) |
|---|---|
| 2400 | 0.43 |
| 2496 | 0.44 |
| 4800 | 30.18 |
| 4900 | 30.98 |
| 4992 | 31.39 |
| 5950 | 36.59 |
| 7200 | 33.06 |
| 7488 | 34.77 |

As shown, between ~4.8 GHz and ~5 GHz, diplexer 122 significantly attenuates the signal. This range of frequencies includes the second harmonics of ~2.4 GHz to ~2.5 GHz signals. Accordingly, diplexer 122 may perform effective filtering, and also route signals appropriately between its three ports 124, 126, 130 without requiring additional second-harmonic filtering.

However, curve 200 represents the behavior of diplexer 122 when the three ports are matched to a specified characteristic impedance, e.g., 50Ω, 50±10Ω, 75Ω, 75±10Ω, or other impedances such as those described above. In some prior schemes this is not always the case during operation of transceiver 100.

Referring back to FIG. 1, signal path 132 shows the flow of data when interface unit 102 is transmitting on band A (e.g., ~2.4 GHz). During such transmission, T/R switch 118 of interface unit 104 may be in either the transmit or the receive position. Moreover, interface unit 104 may be disabled or powered down. Accordingly, the impedance at port 126 may be other than the specified characteristic impedance. The impedance at port 126 may be varying with time, e.g., due to coupling of noise into unpowered active circuit elements. This may degrade the performance of diplexer 122. Specifically, variations in characteristic impedance on port 126 may reduce the attenuation of diplexer 122 at the second harmonic of frequencies in band A. Similarly, variations in characteristic impedance on port 124 may reduce the attenuation of diplexer 122 at the second harmonic of frequencies in band B.

Figure 3:
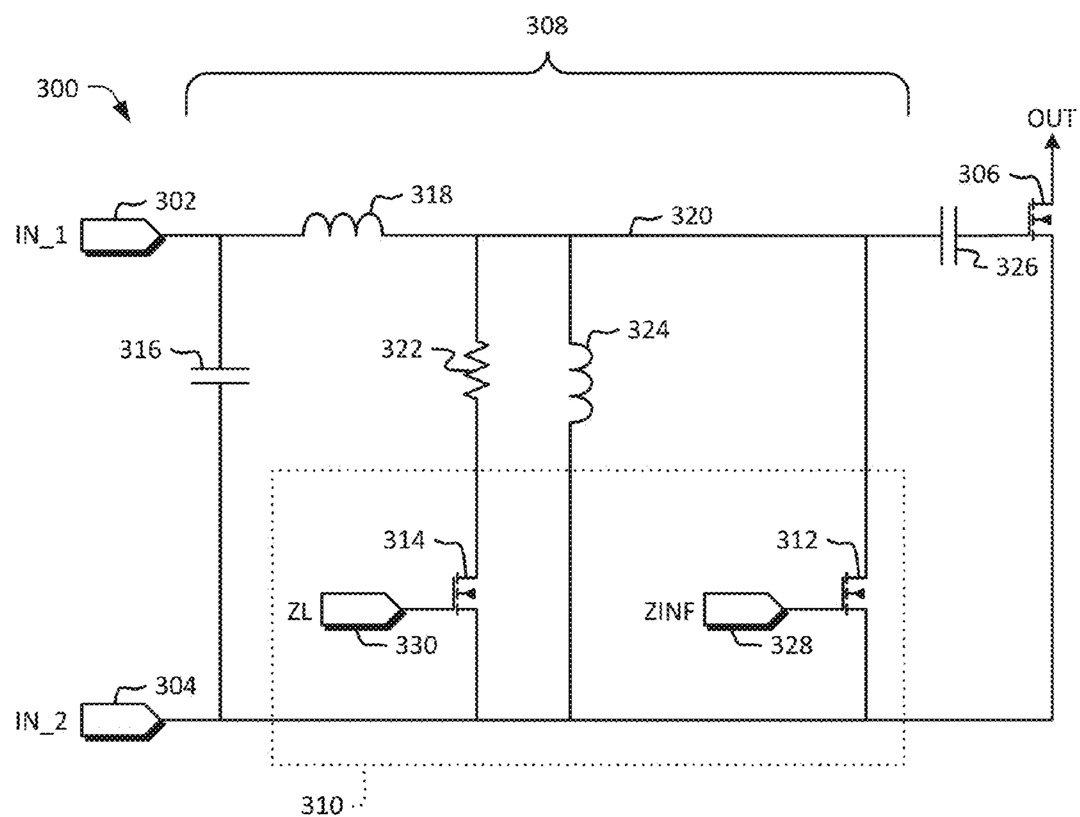
FIG. 3 is a block diagram showing relevant elements of a radio-frequency amplifier according to various embodiments.

FIG. 3 illustrates an example radio-frequency amplifier 300, and specifically a reception (RX) amplifier. RX amplifier 300 may represent band-B RX amplifier 116 in interface unit 104 of transceiver 100, FIG. 1. Still referring to FIG. 1 for context, in some examples, T/R switch 118 of interface unit 104 may be operated to connect RX amplifier 300 to diplexer 122 while interface unit 102 is transmitting data. RX amplifier 300 may provide a controlled impedance to port 126 of diplexer 122 during transmission on band A.

Referring to FIG. 3, RX amplifier 300 is connected to T/R switch 118 (or other upstream connection to an antenna), not shown, via first input terminal 302 (IN_1) and second input terminal 304 (IN_2). Input terminals 302, 304 may be differential input terminals, or may be a single-ended input terminal and a reference-voltage terminal. A gain element 306 provides the output ("OUT"; RX_B on FIG. 1) of RX amplifier 300. Matching network 308 is connected between the input terminals 302, 304 and the gain element 306. Matching network 308 includes a switching unit 310, which includes switches 312 and 314.

In some examples, matching network 308 includes capacitor 316 connected across input terminals 302, 304 and an inductor 318 having a first terminal connected to input terminal 302. A second terminal of inductor 318 is first node 320 and is connected to respective first terminals of resistor 322, inductor 324, switch 312, and capacitor 326 of matching network 308. The second terminal of capacitor 326 is connected to a control input of the gain element 306.

In this example, the gain element 306 includes an N-channel field-effect transistor (NFET), e.g., a metal-oxide-semiconductor (MOS) field-effect transistor (FET) or "MOSFET." The gate of the FET of gain element 306 is the control input. The drain of the illustrated FET of gain element 306 is the output of gain element 306. In some examples, the gain element 306 may include multiple components. In some examples, the gain element 306 may include one or more NFET(s) and one or more P-channel field-effect transistors (PFETs) connected to form a push-pull gain stage. In some examples, the gain element 306 may include one or more junction FETs (JFETs). In some examples, the gain element 306 may include one or more bipolar junction transistors (BJTs), e.g., one or more NPN transistor(s), one or more PNP transistor(s), or one or more NPN transistor(s) and one or more PNP transistor(s) connected to form a push-pull gain stage.

In the illustrated example, switch 312 includes an N-channel FET (NFET), the first terminal of switch 312 is the drain of the FET, a second terminal of switch 312 is the source of the FET, and the gate of the FET is tied to control input 328 (ZINF). In place of MOSFETs, switches described herein may include other types of transistors, e.g., BJTs or JFETs, reed relays, or other switches. In some examples, each switch discussed herein is an electronic switch.

A second terminal of resistor 322 is connected to a first terminal of switch 314 of matching network 308. In various examples, resistor 322 and switch 314 are connected in series between second input terminal 304 and first node 320, in either order. In the illustrated example, switch 314 includes an N-channel FET, the first terminal of switch 314 is the drain of the FET, a second terminal of switch 314 is the source of the FET, and the gate of the FET is tied to control input 330 (ZL).

In the illustrated example, input terminal 304 (IN_2) is connected to the respective second terminals of switch 314, inductor 324, and switch 312 of matching network 308. Input terminal 304 is also tied to a second terminal of gain element 306 (e.g., the source of the illustrated FET of gain element 306).

Accordingly, in the illustrated example, switching unit 310 is responsive to control inputs 328, 330 to interconnect components of RX amplifier 300. In a first condition (ZL asserted; ZINF not asserted), switching unit 310 may interconnect inductor 318, capacitor 316, and resistor 322 to provide a selected impedance into the input terminals 302, 304 at a first selected frequency. In a second condition (ZL not asserted; ZINF asserted), switching unit 310 may interconnect inductor 318 and capacitor 316 to form a bandstop filter at the input terminals 302, 304. A stop band of the thus-formed filter includes a second selected frequency. In some examples, in a third condition (neither ZL nor ZINF asserted), switching unit 310 may turn off both switches 314, 312. The first selected frequency may be, e.g., a second harmonic of a transmission frequency different from the second selected frequency. In an example, the first selected frequency is ~4.8 GHz (second harmonic of ~2.4 GHz) and the second selected frequency is 5 GHz.

In an example, capacitor 316 has a capacitance of 560 fF. Inductor 318 has an inductance of 1.8 nH. Capacitor 326 is a 2 pF capacitor. Inductor 324 is a 4.4 nH inductor. In this example, the series resistance of resistor 322 and switch 314 is 40Ω when switch 314 is on (closed; e.g., the first condition) and 1 kΩ when switch 314 is off (open; e.g., the second condition).

In a first condition, e.g., when interface unit 104 is deactivated, switch 314 is on (closed, e.g., ZL is asserted) and switch 312 is off (open, e.g., ZINF is not asserted). This condition may be present when signals are being transmitted or received in band A, or when signals are neither being received nor being transmitted in band B. In this condition, inductor 318, capacitor 316, and resistor 322 are interconnected to provide a selected impedance into the input terminals 302, 304 (e.g., viewed looking from port 124 of diplexer 122 into RX amplifier 108) at a selected frequency, e.g., at a selected harmonic of a reference frequency of band A. For example, capacitor 316, inductor 318, and resistor 322 may form a lossy tank with substantially a selected characteristic impedance at a selected resonant frequency. Inductor 324 may also form part of the lossy tank. The characteristic impedance may be, e.g., 50Ω or other impedance, e.g., in ranges such as those described above. The resonant frequency may be, e.g., the second-harmonic frequency of band A. In this way, port 126 of diplexer 122, FIG. 1, may have the selected characteristic impedance to preserve attenuation of the second harmonics of transmissions from interface unit 102, FIG. 1.

In a second condition, e.g., when interface unit 104 is receiving data, switches 314, 312 are both off (e.g., neither ZL nor ZINF is asserted). This condition may be present when signals are being received in band B. In this configuration, inductor 324, capacitor 326, or other components not shown provide an expected input impedance across input terminals 302, 304, e.g., the selected characteristic impedance. By opening switch 314, resistor 322 is substantially prevented from degrading the quality or sensitivity of signal reception.

In a third condition, e.g., when interface unit 104 is transmitting data, switch 314 is off (open, e.g., ZL is not asserted) and switch 312 is on (closed, e.g., ZINF is asserted). This condition may be present when signals are being transmitted in band B. In this condition, inductor 318 and capacitor 316 are interconnected to form a bandstop filter at the input terminals 302, 304, a stop band of the filter including the selected frequency. For example, inductor 318 in parallel with capacitor 316 may form a parallel resonant bandstop filter. This filter provides a high impedance to block signals present across input terminals 302, 304 at a selected transmission frequency, e.g., in a 5 GHz band. This filtering shields other components of RX amplifier 300, e.g., switches 314, 312, from high power output by the band-B TX amplifier 114, FIG. 1. Such filtering may reduce stress on, and increase the lifetime of, switches 314, 312.

Filtering as described above with reference to the first and third conditions may also improve rejection of second-harmonic signals emitted by other devices. In some examples, RX amplifier 300 may operate in band B. The filtering described above may reject interference from, e.g., nearby wireless-network devices or cellular phones operating on frequencies in band A. Similarly, filtering as described above with reference to the first and third conditions may improve rejection of other harmonics. For example, the third condition, tuned to a selected transmission frequency of 5 GHz, may reject the fourth harmonic of a nearby 1.25 GHz transmitter.

An inventive RX amplifier similar to RX amplifier 300 was tested. A comparative prior RX amplifier was also tested. The comparative prior RX amplifier did not include resistor 322 or switch 314. The second inductor 324 and the switch 312 in the comparative prior RX amplifier had different component specifications than did the second inductor 324 and the switch 312, respectively, in the inventive RX amplifier. The results were as given in Table 2.

TABLE 2

| Configuration | Antenna | Channel frequency (MHz) | Second-harmonic frequency (MHz) | Second-harmonic amplitude (dB) |
|---|---|---|---|---|
| Comparative | 1 | 2442 | 4884 | −41.148 |
| Inventive | 1 | 2442 | 4884 | −48.727 |
| Comparative | 2 | 2442 | 4884.3 | −38.826 |
| Inventive | 2 | 2442 | 4884.3 | −58.412 |

The inventive configuration improved second-harmonic rejection, i.e., reduced the amplitude of the second harmonic, with respect to the comparative design. In the case of antenna 1, the inventive design improved second-harmonic rejection by ~7 dB. For antenna 2, the inventive design improved second-harmonic rejection by ~20 dB.

Different devices may of course be implemented in different ways, and may have different physical configurations. The device shown in FIG. 3 is merely an example of one possible implementation, serving to illustrate integration of functions and capabilities for multiple impedances across the input terminals of a single device at different times.

Figure 4:
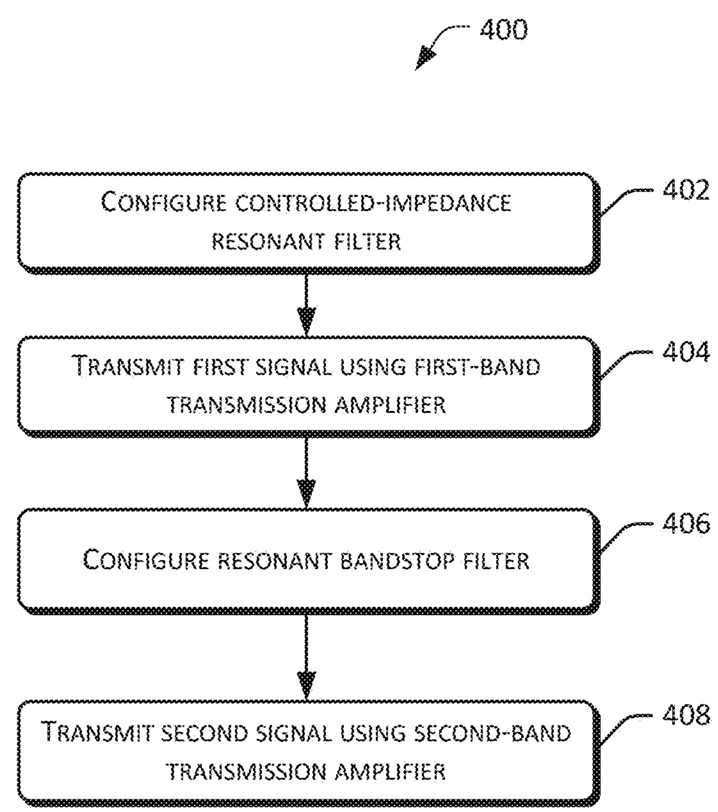
FIG. 4 is a diagram illustrating a method for transmitting signals according to various embodiments.

FIG. 4 illustrates an example method 400 of transmitting first and second signals. As an example, the filtering is performed by transceiver 100, illustrated in FIG. 1. The operations can be performed in any order except when otherwise specified. For clarity of explanation, reference is herein made to various components shown in FIGS. 1 and 3 that can carry out or participate in the operations of the example method. It should be noted, however, that other components can be used; that is, example method(s) shown in FIG. 4 are not limited to being carried out by the identified components. Similarly, components specifically identified below may be used in other configurations than that in which they are illustrated herein, or with other devices or structures, whether or not shown herein.

The first signal is transmitted using a first-band transmission amplifier for a first radio-frequency band, e.g., band A. The first-band transmission amplifier is connected to an antenna, e.g., antenna 128, via a diplexer, e.g., diplexer 122. A second-band reception amplifier for a second, different radio-frequency band, e.g., band B, may be connected to the diplexer 122, e.g., via T/R switch 118. The second-band reception amplifier may include components of RX amplifier 300, FIG. 3.

At 402, a controlled-impedance resonant filter is configured at the input terminals of the second-band reception amplifier. The resonant bandstop filter may be configured before the first signal is transmitted (block 404). Configuring the controlled-impedance resonant filter may include coupling a resistor to a resonant tank circuit, e.g., by closing a first switch such as switch 314 (ZL) and opening a second switch such as switch 312 (ZINF). The controlled-impedance resonant filter may include, e.g., capacitor 316, inductor 318, and resistor 322. The controlled-impedance resonant filter may provide a selected impedance into the two input terminals at a selected harmonic of a reference frequency of the first radio-frequency band, e.g., band A.

At 404, the first signal is transmitted using the first-band transmission amplifier. The controlled-impedance resonant filter may, e.g., provide a predetermined impedance to diplexer 122 during transmission of the first signal.

At 406, a resonant bandstop filter is configured at input terminals of the second-band reception amplifier. Configuring the resonant bandstop filter may include opening a first switch such as switch 314 (ZL) and closing a second switch such as switch 312 (ZINF). The resonant bandstop filter may include a parallel-LC tank circuit, e.g., including capacitor 316 and inductor 318. A stop band of the resonant bandstop filter may include a reference frequency of the second radio-frequency band, e.g., band B.

In some examples, 402 may include connecting a capacitor 316 across the input terminals 302, 304 of the second-band reception amplifier in parallel with a series combination of an inductor 318 and a resistor 322. In some examples, 402 may include connecting a second inductor 324 in parallel with resistor 322. In some examples, 406 may include connecting capacitor 316 and an inductor 318 in parallel across the input terminals 302, 304.

At 408, the second signal is transmitted using a second-band transmission amplifier for the second radio-frequency band, e.g., band B. The second-band transmission amplifier is connected to the antenna via the diplexer. The resonant bandstop filter may shield a gain element 306 from transmit power levels.

Note that the description above incorporates use of the phrases "in an aspect," "in an embodiment," or "in various embodiments," or the like, which may each refer to one or more of the same or different embodiments. Furthermore, the terms "comprising," "including," "having," and the like, as used with respect to embodiments of the present disclosure, are synonymous.

As used herein, the terms "logic," "unit," "component," and "module" may refer to, be part of, or include one or more microprocessors (shared, dedicated, or group), microcontrollers, field-programmable gate arrays (FPGAs), application-specific integrated circuits (ASICs), programmable logic devices (PLDs), programmable logic arrays (PLAs), programmable array logic devices (PALs), or digital signal processors (DSPs), electronic circuits and/or memory (shared, dedicated, or group) that execute one or more software or firmware programs, or combinational logic circuits and/or other suitable components that provide the described functionality. The logic and functionality described herein may be implemented by any such components, singly or in any combination.

In accordance with various embodiments, an article of manufacture may be provided that includes a storage medium having instructions stored thereon that, if executed, result in the operations described above. In an embodiment, the storage medium comprises some type of non-transitory memory (not shown). In accordance with various embodiments, the article of manufacture may be a computer-readable medium such as, for example, software or firmware.

Various operations may have been described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

Although the present disclosure describes embodiments having specific structural features and/or methodological acts, it is to be understood that the claims are not necessarily limited to the specific features or acts described.

What is claimed is:

1. A radio-frequency amplifier, comprising:
a first input terminal;
a second input terminal;
a gain element;
a matching network comprising a switching unit,
wherein the matching network is arranged across the first input terminal and the second input terminal, and between the first input terminal, the second input terminal, and the gain element, and
wherein the switching unit includes a switch and is operable to
(i) in a first condition, set the switch to a first position to provide a selected impedance at a first selected frequency, and
(ii) in a second condition, set the switch to a second, different position to form a bandstop filter, a stop band of the bandstop filter including a second selected frequency.

2. The radio-frequency amplifier of claim 1, wherein the matching network further comprises a resistor, a capacitor, and an inductor.

3. The radio-frequency amplifier of claim 2, wherein the switching unit is operable to, in the first condition, interconnect the inductor, the capacitor, and the resistor to provide the selected impedance.

4. A radio-frequency amplifier, comprising:
a matching network comprising a switching unit, wherein the switching unit includes a switch and is operable to
(i) in a first condition, set the switch to a first position to provide a selected impedance at a first selected frequency, and
(ii) in a second condition, set the switch to a second, different position to form a bandstop filter, a stop band of the bandstop filter including a second selected frequency;
a resistor;
a capacitor; and
an inductor,
wherein the switching unit is operable to, in the second condition, interconnect the inductor and the capacitor and electrically disconnect the resistor to form the bandstop filter.

5. A radio-frequency amplifier, comprising:
a matching network comprising a switching unit, wherein the switching unit includes a switch and is operable to
(i) in a first condition, set the switch to a first position to provide a selected impedance at a first selected frequency, and
(ii) in a second condition, set the switch to a second, different position to form a bandstop filter, a stop band of the bandstop filter including a second selected frequency; a first input terminal; a second input terminal;
a resistor;
a capacitor; and
an inductor,
wherein the capacitor is connected across the first input terminal and the second input terminal,
wherein the inductor is connected between the first input terminal and a first node,
wherein the switch comprises a first electronic switch and the switching unit further comprises a second electronic switch connected between the second input terminal and the first node, wherein the resistor and the first electronic switch are connected in series between the second input terminal and the first node, wherein the first electronic switch is on in the first condition and off in the second condition, and wherein the second electronic switch is off in the first condition and on in the second condition.

6. The radio-frequency amplifier of claim 5, further comprising a second inductor connected in parallel with the second electronic switch.

7. The radio-frequency amplifier of claim 6, wherein, in a third condition, the first electronic switch and the second electronic switch are off.

8. The radio-frequency amplifier of claim 5, further comprising a controller configured to operate the first electronic switch and the second electronic switch.

9. The radio-frequency amplifier of claim 5, further comprising a second capacitor connecting the first node to a gain element.

10. A radio-frequency amplifier, comprising:

a matching network comprising a switching unit, wherein the switching unit includes a switch and is operable to (i) in a first condition, set the switch to a first position to provide a selected impedance at a first selected frequency, and (ii) in a second condition, set the switch to a second, different position to form a bandstop filter, a stop band of the bandstop filter including a second selected frequency, wherein the first selected frequency is a second harmonic of a transmission frequency different from the second selected frequency.

11. A multi-hand transceiver, comprising:

a first-band interface unit for a first radio-frequency band having a first-band reference frequency, the first-band interface unit including a first-band transmission amplifier selectively connectable to a first-band common node;

a second-band interface unit for a second, different radio-frequency band having a second-band reference frequency, the second-band interface unit comprising a second-band transmission amplifier, a second-band reception amplifier comprising two input terminals, and a second-band transmit/receive switch connected to at least one of the two input terminals of the second-band reception amplifier and configured to selectively connect the second-hand transmission amplifier and the second-hand reception amplifier to a second-band common node;

a diplexer connecting the first-band and second-band common nodes and comprising an antenna port configured for connection to an antenna, wherein the diplexer is configured to selectively attenuate signals from the first-band transmission amplifier substantially at a selected harmonic of the first-band reference frequency; and a controller configured to operate the first-band interface unit and the second-band interface unit to selectively provide transmission of signals in the first band or transmission of signals in the second band;

wherein the second-hand reception amplifier includes (i) a first input terminal, (ii) a second input terminal, (iii) a gain element, and (iv) a matching network comprising a switch, wherein the matching network is arranged across the first input terminal and the second input terminal, and between the first input terminal, the second input terminal, and the gain element, and wherein the second-band reception amplifier is responsive to the controller to:

(i) in a first condition, set the switch to a first position to provide a selected impedance into the two input terminals at the selected harmonic of the first-band reference frequency, and (ii) in a second condition, set the switch to a second, different position to provide a bandstop filter across the two input terminals, a stop band of the bandstop filter including the second-band reference frequency.

12. The multi-band transceiver of claim 11, wherein the first-band interface unit further includes:

a first reception amplifier; and a first-band transmit/receive switch selectively connecting the first-band transmission amplifier and the first-band reception amplifier to the first-band common node.

13. The multi-band transceiver of claim 11, wherein the controller is further configured to operate the first-band interface unit and the second-band interface unit to selectively provide reception of signals in the second band.

14. The multi-band transceiver of claim 11, wherein the selected harmonic is a second harmonic.

15. The multi-band transceiver of claim 11, wherein the selected impedance is in a range of 40 to 60 ohms.

16. A method of transmitting a first signal and a second signal, the method comprising:

transmitting the first signal using a first-band transmission amplifier for a first radio-frequency band;

configuring a controlled-impedance resonant filter at a second-band reception amplifier for a second, different radio-frequency band, wherein the controlled-impedance resonant filter provides a selected impedance at a selected harmonic of a reference frequency of the first radio-frequency band;

configuring a resonant bandstop filter at the second-band reception amplifier, wherein a stop band of the resonant bandstop filter includes a reference frequency of the second radio-frequency band; and transmitting the second signal using a second-band transmission amplifier for the second radio-frequency band, wherein the configured resonant bandstop filter blocks at least some power of the transmitted second signal present at input terminals of the second-band reception amplifier.

17. The method of claim 16, wherein the first-band transmission amplifier and the second-band transmission amplifier are connected to an antenna via respective ports of a diplexer.

18. The method of claim 16, wherein the second-band reception amplifier includes two input terminals and the controlled-impedance resonant filter provides the selected impedance into the two input terminals.

19. The method of claim 16, wherein the second-band reception amplifier includes two input terminals and configuring the resonant bandstop filter includes configuring the resonant bandstop filter at the two input terminals.

20. The method of claim 16, wherein configuring the resonant bandstop filter is performed before the transmitting the first signal.

21. The method of claim 16, wherein configuring the controlled-impedance resonant filter comprises coupling a resistor to the resonant bandstop filter.

22. The method of claim 21, wherein the second-band reception amplifier includes two input terminals, configuring the resonant bandstop filter comprises connecting a capacitor and an inductor in parallel across the two input terminals, and configuring the controlled-impedance resonant filter comprises connecting the resistor in series between the inductor and one of the two input terminals.

23. The method of claim 22, wherein configuring the controlled-impedance resonant filter further comprises connecting a second inductor in parallel with the resistor.

24. The method of claim 16, wherein configuring the resonant bandstop filter comprises opening a first switch and closing a second switch.

25. The method of claim 24, wherein configuring the controlled-impedance resonant filter comprises closing a first switch and opening a second switch.

* * * * *